United States Patent [19]

Kawashima

[11] Patent Number: 4,766,475
[45] Date of Patent: Aug. 23, 1988

[54] SEMICONDUCTOR INTEGRATED CIRCUIT DEVICE HAVING AN IMPROVED BUFFER ARRANGEMENT

[75] Inventor: Masatoshi Kawashima, Fuchu, Japan
[73] Assignee: Hitachi, Ltd., Tokyo, Japan
[21] Appl. No.: 946,608
[22] Filed: Dec. 29, 1986

Related U.S. Application Data

[63] Continuation of Ser. No. 634,068, Jul. 25, 1984, abandoned.

[30] Foreign Application Priority Data

Jul. 25, 1983 [JP] Japan ................................. 58-134316

[51] Int. Cl.$^4$ ............................................. H01L 27/02
[52] U.S. Cl. ...................................... 357/40; 357/41; 357/42; 357/45
[58] Field of Search ................... 357/42, 45, 46, 23.13, 357/22, 41, 40

[56] References Cited

U.S. PATENT DOCUMENTS

| | | | |
|---|---|---|---|
| 3,712,995 | 1/1973 | Steubel | 357/42 X |
| 3,746,946 | 7/1973 | Clark | 357/42 X |
| 4,255,672 | 3/1981 | Ohno et al. | 357/45 X |
| 4,513,307 | 4/1985 | Brown | 357/42 |

FOREIGN PATENT DOCUMENTS

| | | | |
|---|---|---|---|
| 0023818 | 2/1981 | European Pat. Off. | |
| 0073608 | 3/1983 | European Pat. Off. | |
| 0093003 | 11/1983 | European Pat. Off. | 357/45 |
| 2349461 | 4/1974 | Fed. Rep. of Germany | |
| 3223276 | 1/1983 | Fed. Rep. of Germany | |
| 0211248 | 6/1981 | Japan | 357/45 |
| 2089611 | 6/1982 | United Kingdom | 357/45 |
| 2104284 | 3/1983 | United Kingdom | 357/45 |

OTHER PUBLICATIONS

Battista, "Multiple Function (I/O) Cell Layout," *IBM Technical Disclosure Bulletin*, vol. 22, No. 7, Dec. 1979, pp. 2772-2774.

Sasaki et al., "A CMOS/SOS Gate Array with a New Customization Technique of Cutting," *IEEE Transactions on Electron Devices*, vol. ED-29, No. 10, Oct. 1982, pp. 1535-1541.

*Primary Examiner*—Andrew J. James
*Assistant Examiner*—William A. Mintel
*Attorney, Agent, or Firm*—Antonelli, Terry & Wands

[57] ABSTRACT

A semiconductor integrated circuit device which includes input and output buffers having a high versatility of design is disclosed. Each buffer provided in correspondence with a bonding pad is made usable for either the input buffer or the output buffer in accordance with a wiring pattern to be formed therein. With this arrangement, it is possible to use the same circuit elements for both the input buffer and the output buffer. Thus, circuit elements to be exclusively used for inputting and outputting respectively need not be separately formed, and the area occupied by the buffers is reduced to that extent, to realize an increase in the number of pins or a reduction in the size of a chip. In addition, since one buffer can be set for either inputting or outputting, enhancement in the versatility of the design of the pins or the chip is achieved.

28 Claims, 4 Drawing Sheets

SEMICONDUCTOR INTEGRATED CIRCUIT DEVICE HAVING AN IMPROVED BUFFER ARRANGEMENT

This application is a continuation of application Ser. No. 634,068, filed on July 25, 1984, now abandoned.

BACKGROUND OF THE INVENTION

The present invention relates to a semiconductor integrated circuit device, and more particularly to a technique which increases the density of integration of input and output buffers in a master slice type semiconductor integrated circuit device. As such, the invention is effective for increasing the number of pins and reducing the size of a chip and further for enhancing the functions of the chip.

A semiconductor integrated circuit device (IC) requires input and output buffers for interfacing with the exterior. As shown in FIG. 1, input or output buffers 4 are disposed and formed between a plurality of bonding pads 2 which are disposed in the peripheral edge of a chip (pellet) 1 and an internal circuit 3 which is disposed in the central area of the chip 1.

In a gate array type or master slice type semiconductor integrated circuit device in which a desired logic circuit can be easily fabricated as the internal circuit by a wiring step, the input and output functions of the bonding pads need to be selected at will in accordance with the design of the internal circuit. To this end, various arrangements are made for the buffers.

FIG. 2 shows an example of one such arrangement. The buffers 4 are provided in correspondence with the bonding pads 2. In each of the buffers 4, circuit elements 5 for constructing the input buffer and circuit elements 6 for constructing the output buffers are formed. In accordance with the design of the internal circuit 3, either the inputting or outputting circuit elements within the buffer 4 are selected and are connected to the bonding pad 2 as well as the internal circuit 3. Thus, the buffer 4 can be constructed as the input or output buffer, and the bonding pad 2 can be constructed as an input terminal or output terminal.

With the above arrangement, however, it is required to form the inputting and outputting circuit elements 5 and 6 in each buffer 4. Therefore, the area occupied by each buffer becomes large. Since the large buffers are arrayed in the peripheral edge of the chip, an increase in the number of the bonding pads 2 (the number of the pins) is limited. On the other hand, when the number of the bonding pads is increased, the chip size enlarges accordingly.

In order to solve this problem, an example in which the number of the bonding pads 2 is approximately double that in the aforementioned example as shown in FIG. 3 has been proposed in Japanese Laid-Open Patent Application No. 57-211248, published Dec. 25, 1982. Both the input buffer and the output buffer can be constructed of one buffer 4, and two bonding pads 2A, 2B are disposed for each buffer. Thus, the input buffer and the output buffer can be connected to the pins and function independently of each other.

The inventor's study, however, has revealed the following. Although the improved arrangement can afford the two functions of inputting and outputting independently of each other by the use of the single buffer, the functions of the respective bonding pads 2A, 2B are limited to inputting (for example, 2A) or outputting (for example, 2B). This leads to problems as stated below. The allotment of the inputting and outputting functions to the respective pads 2 as the signal pins become less versatile, and the versatility of the selection of the functions is diminished. Moreover, although the total number of the pads 2A and 2B increases, the number of the inputting and outputting pads is limited to about ½ of the total number mentioned above. In many circuit applications the number of input signals and output signals does not balance, and one is much larger than the other. This is quite common in logic circuits employed in gate array LSIs. In such cases, the resulting substantial number of pads is not greatly different from the number of pads of the foregoing arrangement in FIG. 2 therefore, it is difficult to achieve the purposes of increasing the number of pads, reducing the chip size, etc.

SUMMARY OF THE INVENTION

An object of the present invention is to provide a semiconductor integrated circuit device which can increase the number of input and output pins while reducing the chip size and which can enhance pin functions and other chip functions.

Another object of the present invention is to provide a semiconductor integrated circuit device which can set input buffers and output buffers at any desired position and in a number approximately double that in the prior art.

The aforementioned and other objects and novel features of the present invention will become apparent from the description of this specification as well as the accompanying drawings.

Typical aspects of performance of the invention disclosed in this specification will be briefly summarized below.

Each buffer provided in correspondence with a bonding pad ia made usable for either an input buffer or an output buffer in accordance with a wiring pattern to be formed therein. It is made possible to use the same circuit elements for both the input buffer and the output buffer. Thus, circuit elements to be exclusively used for inputting and outputting respectively need not be separately formed, and the area occupied by the buffers is reduced to that extent, to realize an increase in the number of pins or reduction in the size of a chip. In addition, since one buffer can be set for either inputting or outputting, enhancement in the function of the pad or in the versatility of the design of the chip is achieved.

BRIEF DESCRIPTION OF THE DRAWINGS

FIG. 7A is a plan view of the state in which a buffer is constructed as an input buffer, while FIG. 8A is a plan view of the state in which the buffer is constructed as an output buffer, while FIG. 8B is an equivalent circuit diagram thereof.

DESCRIPTION OF THE PREFERRED EMBODIMENTS

FIGS. 4A to 8B show an embodiment in which the present invention is applied to a master slice type LSI composed of complementary MISFETs.

Figure 4A:
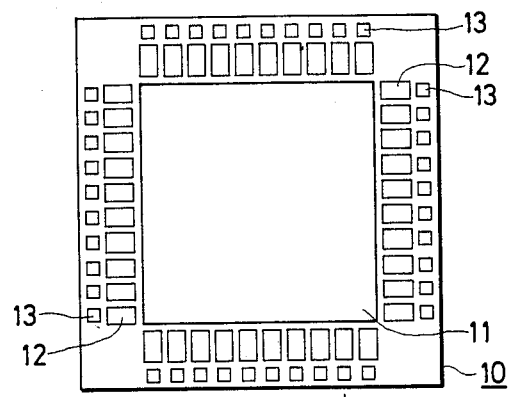
FIGS. 4A and 4B are a plan view and a partial enlarged view of an embodiment of a device of the present invention, respectively.

The semiconductor integrated circuit device 10 is constructed on a substantially square chip (pellet) as generally shown in FIG. 4A. In the central part of the chip, a large number of MISFETs (MIS field effect transistors) of the p-channel and n-channel are formed as the circuit elements of a logic circuit portion 11. In the peripheral edge of the chip, a plurality of buffers 12 and bonding pads 13 corresponding thereto are arrayed. The buffer 12 is a circuit portion for which any of a plurality of different inputting or outputting circuit functions can be selected by altering the wiring pattern thereof. Besides, it is a unit cell for forming an input or output circuit. Such unit cells have the same patterns, except for the wiring patterns, and are arranged as shown in FIG. 4A to provide a plurality of such unit cells along the peripheral edges of the chip. In the illustrated state, no wiring is performed for the circuit elements of the logic circuit portion 11 or the buffers 12 or between the bonding pads 13 and the buffers 12. Logic circuits and input and output circuits as desired can be fabricated by performing wiring at will in the step of wiring.

Figure 4B:
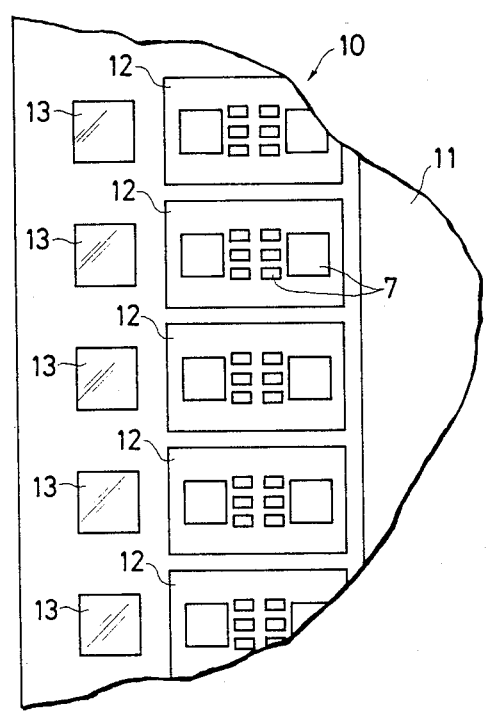

As seen from a partial enlarged view of the peripheral edge portion in FIG. 4B, circuit elements 7 within the buffers 12 are indistinguishably formed so as to be usable when either input buffers or output buffers are to be constructed.

Since inputting elements and outputting elements need not be provided individually in respectively required numbers, the area occupied by the buffer 12 can be reduced to about ½ of that of the buffer 4. As shown in FIG. 4A, the bonding pads 13 which are about double in number as compared with those in the example of FIG. 2 and are substantially equal in number to those in the example of FIG. 3 are arrayed and formed in the peripheral edge of the chip 10. Inside the bonding pads 13, the buffers 12 are formed individually with one buffer 12 corresponding to one bonding pad 13.

Figure 1:
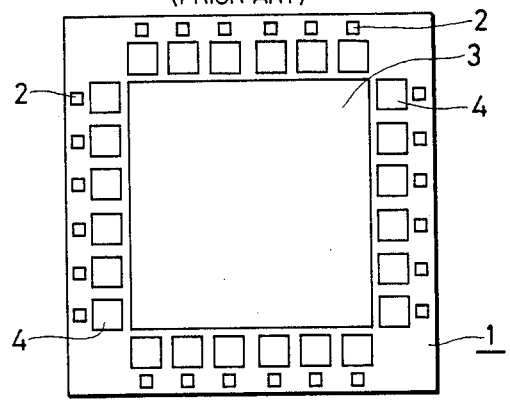
FIG. 1 is a schematic plan view of a general gate array type semiconductor integrated circuit device (chip)
Figure 2:
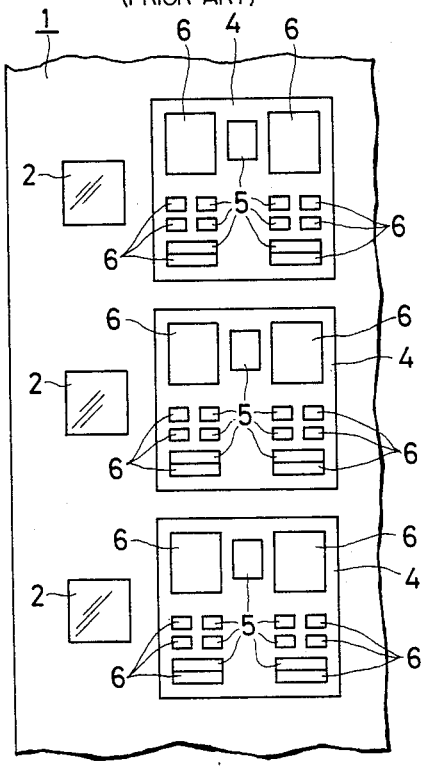
FIG. 2 is a partial enlarged view of an example of a prior art device.
Figure 3:
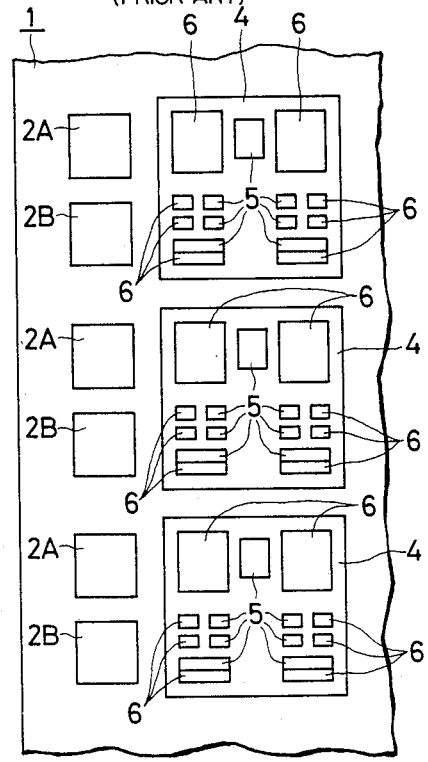
FIG. 3 is a partial enlarged view of another example of a prior art device.

Regarding the example of FIG. 2, since the area occupied by the buffer 12 is rendered about ½ of that of the buffer 4, it is possible to provide the buffers 12 and the bonding pads 13 in a number approximately double that of FIG. 2 on a chip of equal area. The buffer 12 can have its function set at will as the input or output buffer. As to the design of the input and output portions, accordingly, the present embodiment is substantially better than the example of FIG. 2 in terms of design versatility.

Regarding the example of FIG. 3, the number of the bonding pads is equal, but the function of each bonding pad can be set for inputting or outputting at will. This is based on the fact that, by reducing the area of each buffer to ½, the buffers are disposed so that the functions can be set for inputting or outputting at will in correspondence with the individual bonding pads. In the example of FIG. 3, the bonding pads 2A are used for inputting while those 2B for outputting. As to the design of the input and output portions, accordingly, the present embodiment is approximately twice as high as the example of FIG. 3 in design versatility.

Figure 5:
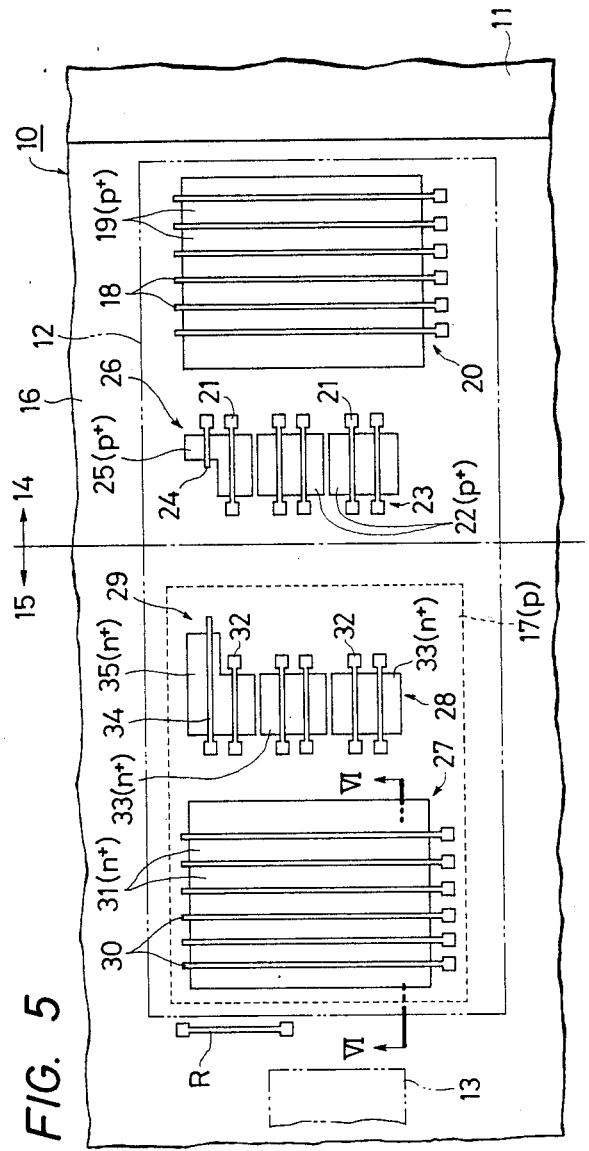
FIG. 5 is an enlarged plan view of a buffer portion.
Figure 6:
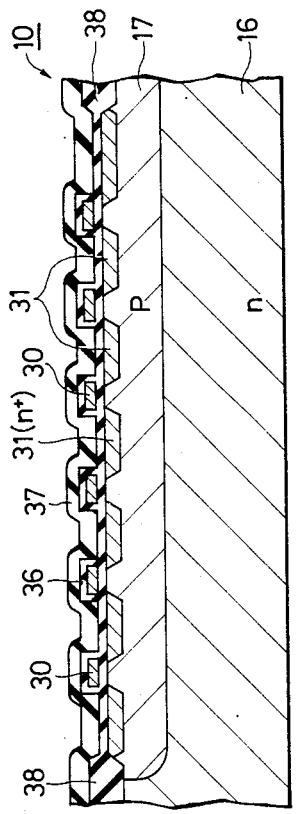
FIG. 6 is an enlarged sectional view taken along line VI—VI in FIG. 5.

The buffer 12 is shown on an enlarged scale in FIG. 5, and its section taken along line VI—VI in FIG. 5 is shown in FIG. 6. The buffer 12 is constructed of a p-channel MOSFET (hereinbelow, termed "pMOS-FET") region 14 on the right side of FIG. 5, and an n-channel MOSFET (hereinbelow, termed "nMOS-FET") region 15 on the left side of FIG. 5. Circuit elements made of the respective MOSFETs are formed in each region. The plurality of pMOSFETs are formed in an n-type silicon semiconductor substrate 16 in the region 14 of the buffer 12, while the plurality of n MOSFETs are formed in a p-type well region 17 formed in the region 15.

The pMOSFETs of the pMOSFET region 14 are comprised as follows. A first group of pMOSFETs 20 consist of six series-connected pMOSFETs which are constructed of six polycrystalline silicon gate electrodes 18 arranged in parallel and p+-type source or drain regions 19 formed in self-alignment to these gates 18, and each of which has its gate width set at 78 μm. A second group of pMOSFETs 23 consists of five pMOSFETs which are constructed of five polycrystalline silicon gate electrodes 21 and n+-type source or drain regions 22 formed in self-alignment thereto, and each of which has a gate width of 20 μm. A third pMOSFET 26 is formed with n+-type source or drain regions 25 in self-alignment to a single gate electrode 24 of polycrystalline silicon, and has its gate width set at 7 μm.

On the other hand, the nMOSFET region 15 is formed with a group of nMOSFETs 27, a second group of nMOSFETs 28 and a third nMOSFET 29 substantially in line symmetry to the pMOSFET region 14. More specifically, as shown in FIG. 6, the first group of nMOSFETs 27 include six series-connected nMOSFETs which are constructed of six polycrystalline silicon gate electrodes 30 formed in parallel, and n+-type source or drain regions 31 formed in self-alignment thereto, and the gate width of each of the nMOSFETs is set at 78 μm. The second group of nMOSFETs 28 consist of five nMOSFETs which are constructed of five polycrystalline silicon gate electrodes 32 and n+-type source or drain regions 33 formed in self-alignment thereto, and each of which has its gate width set at 20 μm. The third nMOSFET 29 is constructed of a polycrystalline silicon gate electrode 34 and n+-type source and drain layers 35 formed in self-alignment thereto, and has its gate width set at 35 μm.

The second group of pMOSFETs 23 and the second group of nMOSFETs 28 are formed in such a manner that every two elements are isolated and that parts thereof and the third pMOSFET 26 and nMOSFET 29 are unitarily constructed respectively. The reason for this is that virtually any logic desired can be readily organized with the arrangement. Also, using this arrangement, an inverter, which is very often used in the input buffer or output buffer, is readily constructed as an inverter having any desired gate width. In FIG. 6, numeral 36 designates an SiO₂ film, numeral 37 a phosphosilicate glass (PSG) film, and numeral 38 a thick SiO₂ film formed by the local oxidation of the substrate surface.

According to the above construction, when aluminum (Al) wiring leads are formed on the buffer 12 in the wiring step, this buffer can be constructed as the input buffer or output buffer in accordance with the wiring pattern.

Figure 7A:
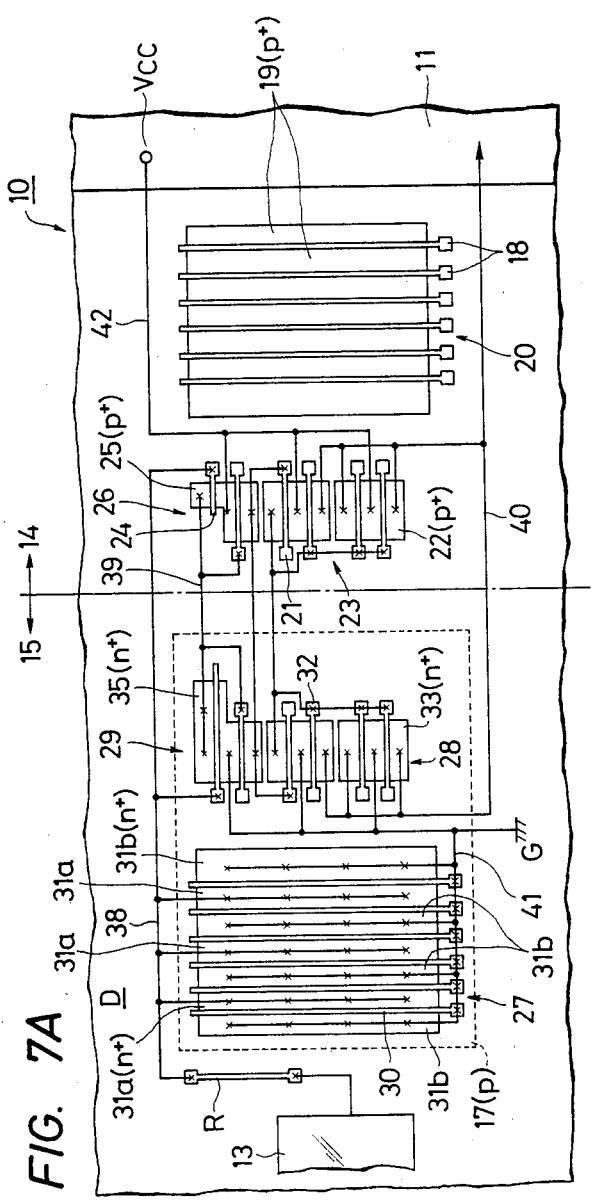
Figure 7B:
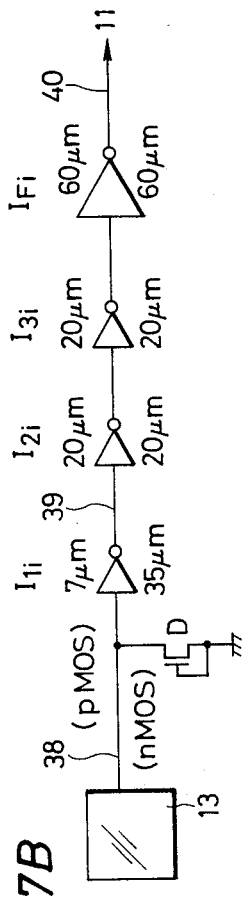
FIG. 7B is an equivalent circuit diagram thereof.

FIGS. 7A and 7B show the state in which the buffer 12 is constructed as the input buffer. Marks X in the drawing denote the connections between the respective regions (the same holds true hereinbelow).

A wiring lead 38 connected to the bonding pad 13 is connected to n+-type semiconductor layers 31a which serve as electrodes for causing the currents of the first group of nMOSFETs 27 to flow. The gates 30, and the semiconductor layers 31b which serve as electrodes for causing the currents of the MOSFETs to flow are connected to the ground potential G as a reference potential. The six MOSFETs have all the gates, sources and drains connected in parallel respectively, whereby they become, in effect, a MOSFET which has a gate width of 468 (=78 μm×6) μm and which is constructed as a clamping diode D. The diode D serves to prevent the destruction of the MOSFET whose gate electrodes are supplied with a signal from the bonding pad 13. That is, this MOSFET is a protective MOSFET for preventing the destruction of the other MOSFETs. An input protective resistor R which is made of a polycrystalline silicon film likewise to the gate electrode is disposed between the bonding pad 13 and the clamping diode D.

A wiring lead 39 connects the third nMOSFET 29 and the third pMOSFET 26, to construct a first-stage CMOS inverter $I_{li}$. One MOSFET is selected from each of the second group of nMOSFETs 28 and the second group of pMOSFETs 23 so as to construct a second-stage CMOS inverter $I_{2i}$ in which the respective MOSFETs have gate width of 20 μm. Similarly, a third-stage CMOS inverter $I_{3i}$ is constructed. Three MOSFETs are selected from the second group of nMOSFETs 28, and are connected in parallel. Three MOSFETs are selected from the group of pMOSFETs 23, and are connected in parallel. Each of the parallel connections of the MOSFETs is regarded as one MOSFET having a gate width of 60 (=20 μm×3) μm, and a final-stage CMOS inverter $I_{Fi}$ is constructed by the use of these parallel connections. The output of the final-stage inverter $I_{Fi}$ is connected to the internal circuit portion 11 by a wiring lead 40. In FIG. 7A, numeral 41 indicates a wiring lead for connecting the ground potential, and numeral 42 a wiring lead for connecting a power source potential ($V_{CC}$).

The input buffer thus constructed becomes a circuit arrangement shown in FIG. 7B. Excess current is clamped by the large clamping diode D having the gate width of 468 μm. A signal level is adjusted, that is, a logic threshold voltage is adjusted by the respective gate widths 35 μm and 7 μm of the nMOSFET 29 and pMOSFET 26 of the first-stage inverter $I_{li}$. Thus, the input signal from a TTL is suited to the CMOS device. The input signal is wave-shaped by the second and third stages of CMOS inverters $I_{2i}$ and $I_{3i}$, and is thereafter amplified by the final stage of CMOS inverter $I_{Fi}$. The output of the buffer is connected to the internal circuit portion 11 by the wiring lead 40. The input buffer does not use the first group of pMOSFETs 20.

FIGS. 8A and 8B show the state in which the buffer 12 is constructed as the output buffer.

A wiring lead 43 connected to the internal circuit 11 connects one MOSFET selected from each of the second group of nMOSFETs 28 and the second group of pMOSFETs 23, to construct a first-stage CMOS inverter $I_{10}$ in which the gate widths of the respective MOSFETs are 20 μm. Two MOSFETs are selected from the group of MOSFETs 28, and are connected in parallel. Two MOSFETs are selected from the group of MOSFETs 23, and are connected in parallel. Each of the parallel connections of the MOSFETs is, in effect, deemed one MOSFET having a gate width of 40 μm, and a second-stage CMOS inverter $I_{20}$ is constructed by the use of these parallel connections. All the MOSFETs of the first groups of nMOSFETs 27 and pMOSFETs 20 are connected in parallel respectively. Each of the parallel connections is deemed one MOSFET having a gate width of 468 μm, and a final-stage CMOS inverter $I_{FO}$ for driving an external circuit is constructed by the use of these parallel connections. The third nMOSFET 29 and pMOSFET 26 are not used. In FIGS. 8A and 8B, numeral 44 indicates a wiring lead for connecting the ground potential, numeral 45 indicates a wiring lead for connecting the power source potential ($V_{CC}$), and a wiring lead 46 is connected to the bonding pad 13 as an output line.

The output buffer thus constructed becomes a circuit arrangement shown in FIG. 8B. An output signal from the internal circuit portion 11 wave-shaped and amplified by the first stage and second stage of CMOS inverters $I_{10}$, $I_{20}$ is greatly amplified by the final stage of CMOS inverter $I_{FO}$, and the amplified signal is supplied to the bonding pad 13 and delivered to the exterior so as to drive the external circuit.

All the buffers 12 shown in FIGS. 4A and 4B have the arrangement depicted in FIG. 5. Accordingly, any of the buffers 12 can be set as either the input buffer or the output buffer at will, and the bonding pad 13 can be set as either the input pin or the output pin.

With the semiconductor device (chip) of the above construction, accordingly, the respective elements of the first, second and third nMOSFETs 27, 28, 29 and pMOSFETs 20, 23, 26 in the buffer 12 can be utilized as the inputting or outputting elements merely by altering their connections with different wiring patterns, and the entire buffer 12 can be set for either inputting or outputting at will. Thus, the buffer 12 can have the area which it occupies reduced by effectively omitting unnecessary elements to the extent that the elements which are used can be used for both inputting and outputting. Accordingly, the density of disposing the buffers on the chip 10 is enhanced, and increases in the number of buffers and the number of bonding pads (the number of pins) corresponding thereto can be achieved. Conversely, when the number of buffers is held equal, reduction in the chip size can be achieved.

Meanwhile, since the buffer 12 can be set for either inputting or outputting at will, the bonding pad 13 can be freely set as either the input terminal or the output terminal. Accordingly, even in the kind of a circuit device in which only input signals or output signals are large in number, the number of bonding pads can be caused to correspond thereto, and moreover, the arrangement of the input and output terminals is at will. Thus, the versatility of the design of the terminal functions or the functions of the whole chip can be enhanced. By the way, the versatility of setting the pin functions can be rendered double or higher than in the prior art device shown in FIG. 2 or FIG. 3.

According to the foregoing construction, a clock receiving buffer can also be constructed in such a way that two of the buffers 12 are used between which wiring utilizing the elements is laid. A bidirectional buffer may well be constructed.

The present invention brings forth effects as stated below.

Since elements in a buffer can be utilized for either inputting or outputting by altering wiring, the buffer can be set as either an input buffer or an output buffer at will. Therefore, a bonding pad provided in correspondence with the buffer can have enhanced pin versatility for inputting and outputting, and the versatility of design for the whole chip can be enhanced.

Since the same elements in the buffer can be utilized for both inputting and outputting, the number of required elements can be decreased to that extent. Thus, the area occupied by one buffer is reduced, so that the number of buffers or the number of bonding pads which can be formed on an identical chip can be increased.

Since the area occupied by one buffer can be reduced, the chip size can be reduced in case of an equal number of pins. Regarding this, it should be noted that, in a CMOS master slice on the scale of 1000-2000 gates, the chip size is primarily determined by the number of input and output buffers.

The buffer can be set for either inputting or outputting, while at the same time, an increase in the number of pins (the number of bonding pads) can be realized owing to the reduced area occupied by the buffer. Especially in a semiconductor integrated circuit device in which the number of input signals and output signals do not balance and either number is much larger, the versatility of design is high.

Since the buffer is constructed into a CMOS structure, the power consumption of the buffer can be reduced.

Since the buffer is constructed of a plurality of MISFETs of unit gate width, a MISFET of desired gate width or various circuits employing such MISFETs can be constructed in accordance with the connection number of the elements, and the versatility of the circuit of the input or output buffer can be enhanced.

Since either a clamping MOSFET requiring a large area in the input buffer or an external circuit driving MOSFET requiring a large area in the output buffer is formed by the same MOSFET, the buffer area can be sharply reduced.

While, in the above, the invention made by the inventor has been concretely described in conjunction with the illustrated embodiment, it is needless to say that the present invention is not restricted to the foregoing embodiment but that it can be variously modified within a scope not departing from the subject matter thereof.

For example, the buffer need not necessarily be constructed of CMOS transistors. On the contrary, if desired, it may well be constructed only of pMOSFETs or, preferably, nMOSFETs. In addition, the pattern configuration of concrete elements (MISFETs) within the buffer or the number of gates and the gate widths thereof, and, furthermore, the circuits of input and output buffers formed by wiring can be freely designed differently from the illustration. Besides this, the internal circuit may be designed either by the master slice method or to form a predetermined exclusive circuit. Furthermore, the elements can be constructed of bipolar transistors.

While, in the above, the invention made by the inventor has been chiefly explained as to the application to a CMOS logic master slice LSI being the background thereof, it is not restricted thereto but is applicable to general semiconductor devices having input and output buffers.

It is to be understood that the above-described arrangements are simply illustrative of the application of the principles of this invention. Numerous other arrangements may be readily devised by those skilled in the art which embody the principles of the invention and fall within its spirit and scope.

I claim:

1. A semiconductor integrated circuit device comprising:
   a semiconductor substrate;
   a logic circuit portion formed at a predetermined location of said semiconductor substrate;
   a plurality of unit cells which are formed at a predetermined location of said semiconductor substrate, each said unit cell including MISFETs which are interconnected in order to form one of an input circuit and an output circuit for said logic circuit portion independently of interconnections made for others of said plurality of unit cells, wherein said MISFETs, before being interconnected, have a dual identity of both input and output possible circuits;
   a plurality of bonding pads which are formed on said semiconductor substrate so that each bonding pad is adjacent to a predetermined unit cell; and
   wiring leads which serve to interconnect MISFETs of said each unit cell to form one of an input circuit and an output circuit and which include an interconnection with an adjacent bonding pad,
   said MISFETs being arranged such that a predetermined MISFET in each of said unit cells will form a protective MISFET connected to other MISFETs in the unit cell and between an adjacent bonding pad and a predetermined reference potential to prevent destruction of any of said other MISFETs whose gate electrode is supplied with a signal from the bonding pad in said unit cells interconnected to form an input circuit.

2. A semiconductor integrated circuit device according to claim 1, wherein the predetermined MISFET is an n-channel MOSFET.

3. A semiconductor integrated circuit device according to claim 1, wherein said MISFETs include n-channel MISFETs and p-channel MISFETs, and said predetermined MISFET is an n-channel MISFET.

4. A semiconductor integrated circuit device according to claim 3, wherein said predetermined MISFET is coupled with a p-channel MISFET to form an inverter of a final output stage in said unit cell forming said output circuit.

5. A semiconductor integrated circuit device comprising:
   a semiconductor substrate;
   a logic circuit portion formed at a predetermined location of said semiconductor substrate;
   a plurality of unit cells which are formed at a predetermined location of said semiconductor substrate, each said unit cell including MISFETs which are interconnected in order to form one of an input circuit and an output circuit for said logic circuit portion independently of interconnections made for others of said plurality of unit cells, wherein said MISFETs, before being interconnected, have a dual identity of both input and output possible circuits;
   a plurality of bonding pads which are formed on said semiconductor substrate so that each bonding pad is adjacent to a predetermined unit cell; and
   wiring leads which serve to interconnect MISFETs of said each unit cell to form one of an input circuit and an output circuit and which include an interconnection with an adjacent bonding pad,
wherein said predetermined MISFETs are arranged such that in each of said unit cells at least two of said predetermined MISFETs are connected electrically in parallel by said wiring leads, have gate electrodes geometrically parallel to each other, and share semiconductor regions functioning as source or drain regions with the MISFETs adjoining them.

6. A semiconductor integrated circuit device according to claim 5, wherein said at least two MISFETs connected electrically in parallel have gate electrodes of substantially the same shape and have substantially equal channel lengths and channel widths.

7. A semiconductor integrated circuit device according to claim 6, wherein the at least two parallel-connected MISFETs form a protective MISFET connected to other MISFETs in the unit cell and between an adjacent bonding pad and a predetermined reference potential to prevent destruction of said other MISFETs in said unit cells interconnected to form an input circuit.

8. A semiconductor integrated circuit device according to claim 7, wherein said MISFETs include n-channel MISFETs and p-channel MISFETs, said protective MISFET is comprised of the n-channel MISFETs, and wherein each of the parallel-connected MISFETs is coupled with a p-channel MISFET to form an inverter of a final output stage in said unit cells interconnected to form an output circuit.

9. A semiconductor integrated circuit device according to claim 5, wherein the parallel-connected MISFETs include a first group of MISFETs which have gate electrodes of substantially the same shape and have substantially equal channel lengths and channel widths, and second groups of MISFETs which have gate electrodes of substantially the same shape of gate electrodes and have substantially equal channel lengths and channel widths, wherein the channel widths of said second group of MISFETs are smaller than those of said first group of MISFETs.

10. A semiconductor integrated circuit device according to claim 9, wherein said first group of MISFETs constitute a protective MISFET, and said second group of MISFETs provide another part of the input circuit in said unit cells interconnected to form an input circuit, said protective MISFET preventing destruction of said second group of MISFETs whose gate electrodes are supplied with a signal from an adjacent bonding pad, and further wherein said first group of MISFETs constitute a part of an inverter of a final output stage, and said second group of MISFETs provide another part of the output circuit in said unit cells interconnected to form an output circuit.

11. A semiconductor integrated circuit device according to claim 10, wherein said each second group is comprised of two MISFETs.

12. A semiconductor integrated circuit device comprising:
a semiconductor substrate;
a logic circuit portion formed at a predetermined location of said semiconductor substrate;
a plurality of unit cells which are formed at a predetermined location of said semiconductor substrate, each said unit cell including n-channel MISFETs and p-channel MISFETs which are interconnected in order to form one of an input circuit and an output circuit for said logic circuit portion independently of interconnections made for others of said plurality of unit cells, wherein said MISFETs, before being interconnected, have a dual identity of both input and output possible circuits, said n-channel MISFETs, before being interconnected, have a dual identity of both input and output possible circuits. said n-channel MISFETs and p-channel MISFETs including groups each comprised of a plurality of n-channel MISFETs and groups each comprised of a plurality of p-channel MISFETs, said MISFETs of said groups being formed so as to have gate electrodes geometrically parallel to each other and to share semiconductor regions as source or drain regions with the MISFETs adjoining each other;
a plurality of bonding pads which are formed on said semiconductor substrate so that each bonding pad is adjacent to a predetermined unit cell; and
wiring leads which serve to interconnect MISFETs of said each unit cell to form one of an input circuit and an output circuit and which include an interconnection with an adjacent bonding pad,
wherein said MISFETs are arranged such that a first group comprised of a plurality of n-channel MISFETs connected electrically in parallel with each other will form a protective MISFET connected to other MISFETs in said unit cell and between an adjacent bonding pad and a predetermined reference potential to prevent destruction of any of said other MISFETs whose gate electrodes are supplied with a signal from the bonding pad in said unit cells interconnected to form an input circuit; and wherein the same first group comprised of the plurality of n-channel MISFETs and a second group comprised of a plurality of p-channel MISFETs, said plurality of n-channel MISFETs and p-channel MISFETs being respectively connected electrically in parallel with each other, will form an inverter of a final output stage in said unit cells interconnected to form an output circuit.

13. A semiconductor integrated circuit device according to claim 12, wherein the input circuit operation except said protective MISFET and the output circuit operation except the final-stage inverter are provided by other groups comprised of the plurality of n-channel MISFETs and other groups comprised of the plurality of p-channel MISFETs than the aforementioned first and second groups, and each of the other groups is comprised of two MISFETs which have gate electrodes physically parallel to each other and which share a semiconductor region functioning as a source or drain region.

14. A semiconductor integrated circuit device according to claim 13, wherein channel widths of the MISFETs of said first and second groups are greater than channel widths of the MISFETs of the other groups.

15. A semiconductor integrated circuit device according to claim 14, wherein said first and second MISFETs have gate electrodes of the same shape.

16. A semiconductor integrated circuit device comprising:
a semiconductor substrate;
a logic circuit portion formed at a predetermined location of said semiconductor substrate;
a plurality of unit cells which are formed at a predetermined location of said semiconductor substrate, each said unit cell including MISFETs which are interconnected in order to form one of an input circuit and an output circuit for said logic circuit portion independently of interconnections made for others of said plurality of unit cells, wherein said MISFETs, before being interconnected, have a dual identity of both input and output possible circuits, said MISFETs including groups each comprised of a plurality of MISFETs which are formed so as to have gate electrodes geometrically parallel to each other and to share semiconductor regions as source or drain regions with the MISFETs adjoining each other; and bonding pads which are formed on said semiconductor substrate so that each bonding pad is adjacent to a predetermined unit cell.

17. A semiconductor integrated circuit device according to claim 16, wherein said groups each comprised of the plurality of MISFETs include a first group comprised of MISFETs which have equal channel widths, and other groups each comprised of MISFETs which have equal channel widths smaller than channel widths of said MISFETs of said first group.

18. A semiconductor integrated circuit device according to claim 17, wherein said first group is comprised of at least three MISFETs, and each of the other groups is comprised of two MISFETs.

19. A semiconductor integrated circuit device according to claim 16, wherein said MISFETs include n-channel MISFETs and p-channel MISFETs, and said groups each comprised of the plurality of MISFETs include a first group comprised of n-channel MISFETs which have equal channel widths, a second group comprised of p-channel MISFETs which have equal channel widths, third groups each comprised of MISFETs which have equal channel widths smaller than channel widths of said MISFETs of said first group, and fourth groups each comprised of MISFETs which have equal channel widths smaller than channel widths of said MISFETs of said each third group.

20. A semiconductor integrated circuit device according to claim 19, wherein each of said first and second groups is comprised of at least three MISFETs, and each of said third and fourth groups is comprised of two MISFETs.

21. A semiconductor integrated circuit device according to claim 20, wherein said MISFETs of said first and second groups have gate electrodes parallel to each other and have equal channel widths, and said MISFETs of said third and fourth groups are arranged between said first and second groups with said third group adjoining said first group and with said fourth group adjoining said second group.

22. A semiconductor integrated circuit device according to claim 21, wherein said MISFETs of said third and fourth groups have gate electrodes which extend orthogonally to a direction in which the gate electrodes of said MISFETs of said first and second groups extend.

23. A semiconductor integrated circuit device comprising:
a semiconductor substrate;
a plurality of unit cells which are identical except for wiring patterns on the substrate, each unit cell having a plurality of MISFETs;
a plurality of bonding pads formed on said semiconductor substrate with each bonding pad being adjacent to a single respective unit cell to form a plurality of bonding pad-unit cell pairs each comprised of a single bonding pad and a single unit cell;
wiring leads for interconnecting said bonding pads to said unit cells, and including an interconnection for at least some of said MISFETs of said unit cells so that each unit cell forms one of an input circuit and an output circuit independently of the interconnections made for other unit cells, wherein said MISFETs, before being interconnected, have a dual identity of both input and output possible circuits, and wherein at least one first MISFET in each of said unit cells forming said input circuit has a corresponding at least one first MISFET in each of said unit cells forming said output circuit.

24. A semiconductor integrated circuit device according to claim 23, wherein said one first MISFET in said unit cells forming said input circuit is connected with predetermined elements in said unit cells to form a protective MISFET and said one first MISFET in said unit cells forming said output circuit is connected with predetermined elements in said unit cells to form an inverter of a final output stage.

25. A semiconductor integrated circuit device according to claim 1, wherein said bonding pads are arranged so that each bonding pad is adjacent to a single respective unit cell so that a plurality of bonding pad-unit cell pairs are formed with each of said bonding pad-unit cell pairs consisting of a single bonding pad and a single unit cell.

26. A semiconductor integrated circuit device according to claim 5, wherein said bonding pads are arranged so that each bonding pad is adjacent to a single respective unit cell so that a plurality of bonding pad-unit cell pairs are formed with each of said bonding pad-unit cell pairs consisting of a single bonding pad and a single unit cell.

27. A semiconductor integrated circuit device according to claim 12, wherein said bonding pads are arranged so that each bonding pad is adjacent to a single respective unit cell so that a plurality of bonding pad-unit cell pairs are formed with each of said bonding pad-unit cell pairs consisting of a single bonding pad and a single unit cell.

28. A semiconductor integrated circuit device according to claim 16, wherein said bonding pads are arranged so that each bonding pad is adjacent to a single respective unit cell so that a plurality of bonding pad-unit cell pairs are formed with each of said bonding pad-unit cell pairs consisting of a single bonding pad and a single unit cell.

* * * * *